(12) United States Patent
Ammon et al.

(10) Patent No.: US 10,790,207 B2
(45) Date of Patent: Sep. 29, 2020

(54) POWER SEMICONDUCTOR DEVICE COMPRISING A POWER SEMICONDUCTOR COMPONENT AND A HOUSING

(71) Applicant: SEMIKRON ELEKTRONIK GMBH & CO. KG, Nuremberg (DE)

(72) Inventors: Jörg Ammon, Erlangen (DE); Harald Kobolla, Seukendorf (DE); Stefan Weiss, Höchstadt (DE)

(73) Assignee: SEMIKRON ELEKTRONIK GmbH & CO. KG, Nuremberg (DE)

( * ) Notice: Subject to any disclaimer, the term of this patent is extended or adjusted under 35 U.S.C. 154(b) by 17 days.

(21) Appl. No.: 16/415,677

(22) Filed: May 17, 2019

(65) Prior Publication Data
US 2020/0013687 A1 Jan. 9, 2020

(30) Foreign Application Priority Data
Jul. 6, 2018 (DE) .......................... 10 2018 116 429

(51) Int. Cl.
*H01L 23/48* (2006.01)
*H01L 23/04* (2006.01)
(Continued)

(52) U.S. Cl.
CPC .............. *H01L 23/04* (2013.01); *H01L 23/48* (2013.01); *H01L 23/528* (2013.01); *H01L 24/72* (2013.01);
(Continued)

(58) Field of Classification Search
CPC ....... H01L 23/04; H01L 23/48; H01L 23/528; H01L 24/72; H01R 12/714; H05K 7/1427
See application file for complete search history.

(56) References Cited

U.S. PATENT DOCUMENTS

2014/0151868 A1* 6/2014 Bayerer ................ H01L 23/049
257/690
2016/0247735 A1* 8/2016 Lin .................... H01L 23/49844
(Continued)

FOREIGN PATENT DOCUMENTS

DE 102012219791 5/2013

OTHER PUBLICATIONS

DE 10 2018 116 429.7, German Examination Report dated Feb. 2, 2019, 7 pages—German, 3 pages—English.

*Primary Examiner* — Long K Tran
(74) *Attorney, Agent, or Firm* — Lackenbach Siegel, LLP; Andrew F. Young

(57) ABSTRACT

The invention relates to a power semiconductor device comprising a pin element which passes through a housing opening, comprising a support device, further comprising an elastic sealing device which is arranged on the support device, comprising a pressure device which is arranged on the sealing device, and comprising an electrically conductive sleeve. A first pressure element of the pressure device presses a first sealing element of the sealing device against a first support element of the support device in the axial direction of the pin element causes deformation of the first sealing element so that the first sealing element presses against the housing opening wall and against the sleeve in a perpendicular direction in relation to the axial direction of the pin element. A second pressure element of the pressure device is designed to press a second sealing element of the sealing device against a second support element of the support device in the axial direction of the pin element and in this way to cause deformation of the second sealing element in such a way that the second sealing element presses against the sleeve and against the pin element in a (Continued)

perpendicular direction in relation to the axial direction of the pin element.

13 Claims, 5 Drawing Sheets

(51) Int. Cl.
    *H01L 23/528*     (2006.01)
    *H01L 23/00*     (2006.01)
    *H05K 7/14*     (2006.01)
    *H01R 12/71*     (2011.01)

(52) U.S. Cl.
    CPC ......... *H01R 12/714* (2013.01); *H05K 7/1427* (2013.01); *H01L 2224/8384* (2013.01); *H01L 2224/83801* (2013.01)

(56) References Cited

U.S. PATENT DOCUMENTS

2017/0102507 A1     4/2017   Menguy et al.
2019/0385919 A1*   12/2019   Hunka .................... H01L 23/48

* cited by examiner

POWER SEMICONDUCTOR DEVICE COMPRISING A POWER SEMICONDUCTOR COMPONENT AND A HOUSING

CROSS REFERENCE TO RELATED APPLICATIONS

This application relates to, and claims priority from, DE Ser. No.: 10 2018 116 429.7 filed Jul. 6, 2018, the entire contents of which are incorporated herein by reference.

FIGURE SELECTED FOR PUBLICATION

FIG. 2.

BACKGROUND OF THE INVENTION

Field of the Invention

The present invention relates to a power semiconductor device comprising a power semiconductor component and a housing.

Description of the Related Art

DE 10 2012 219 791 A1 discloses a power semiconductor device comprising power semiconductor components, a housing and comprising electrical connection elements. The electrical connection elements of the power semiconductor device serve to electrically connect electrically conductive load current connection elements. Here, the electrical connection elements of the power semiconductor device run through a housing wall from the inside to the outside of the housing. In order to prevent the ingress of particles of dirt and moisture into the interior of the housing, the electrical connection elements of the power semiconductor device are sealed off from the housing wall.

ASPECTS AND SUMMARY OF THE INVENTION

One of the alternative and adaptive objects of the invention is to provide a power semiconductor device comprising a housing, in which power semiconductor device the ingress of particles of dirt and moisture into the interior of the housing is prevented in a reliable manner and over the long term.

This object is achieved by a power semiconductor device comprising a power semiconductor component, comprising a housing having a housing opening, comprising a pin element which passes through the housing opening and has a thread at least outside the housing, comprising a support device which is arranged between a housing opening wall of the housing, which housing opening wall delimits the housing opening and encircles the pin element, and the pin element, comprising an elastic sealing device which is arranged between the housing opening wall of the housing and the pin element on the support device and runs around the pin element, comprising a pressure device which runs around the pin element and is arranged on the sealing device, and comprising an electrically conductive sleeve which forms an electrical connection element of the power semiconductor device, wherein the pin element runs through the sleeve, through a support device opening of the support device, through a sealing device opening of the sealing device and through a pressure device opening of the pressure device, wherein a first support element of the support device and a first sealing element of the sealing device are arranged between the sleeve and the housing opening wall, wherein a second support element of the support device, a second sealing element of the sealing device and a second pressure element of the pressure device are arranged between the sleeve and the pin element, wherein a first pressure element of the pressure device is arranged around the sleeve, wherein the first pressure element is designed to press the first sealing element against the first support element in the axial direction of the pin element and in this way to cause deformation of the first sealing element in such a way that the first sealing element presses against the housing opening wall and against the sleeve in a perpendicular direction in relation to the axial direction of the pin element, wherein the second pressure element is designed to press the second sealing element against the second support element in the axial direction of the pin element and in this way to cause deformation of the second sealing element in such a way that the second sealing element presses against the sleeve and against the pin element in a perpendicular direction in relation to the axial direction of the pin element.

It has proven to be advantageous when the sealing device is formed from an elastomer, in particular from a crosslinked silicone, in particular from a crosslinked silicone rubber, since very reliable sealing off is achieved in this case.

Furthermore, it has proven to be advantageous when the sleeve has a first recess which starts from its side that faces a pin element outer end of the pin element, which pin element outer end is arranged outside the housing, and which runs in the axial direction of the pin element, wherein the sleeve has a first recess bottom surface which delimits the first recess, wherein the support device is of one-piece design and has a first support connecting section which runs through the first recess and is arranged on the first recess bottom surface and connects the first support element to the second support element, since the first support element is reliably connected to the second support element in this case.

In this context, it has proven to be advantageous when the sleeve has a second recess which starts from its side that faces a pin element outer end of the pin element, which pin element outer end is arranged outside the housing, and which runs in the axial direction of the pin element, wherein the sleeve has a second recess bottom surface which delimits the second recess, wherein the support device has a second support connecting section which runs through the second recess and is arranged on the second recess bottom surface and connects the first support element to the second support element, since the first support element is reliably connected to the second support element in this case.

It has further proven to be advantageous when the sealing device is of one-piece design and has a first sealing device connecting section which runs through the first recess and connects the first sealing element to the second sealing element, since the first sealing element is particularly reliably connected to the second sealing element in this case.

In this context, it has proven to be advantageous when the sleeve has a second recess which starts from its side that faces a pin element outer end of the pin element, which pin element outer end is arranged outside the housing, and which runs in the axial direction of the pin element, wherein the sealing device has a second sealing device connecting section which runs through the second recess and connects the first sealing element to the second sealing element, since the first sealing element is particularly reliably connected to the second sealing element in this case.

It has further proven to be advantageous when the pressure device is of one-piece design and has a first pressure device connecting section which runs through the first recess and connects the first pressure element to the second pressure element, since the first pressure element is reliably connected to the second pressure element in this case.

In this context, it has proven to be advantageous when the sleeve has a second recess which starts from its side that faces a pin element outer end of the pin element, which pin element outer end is arranged outside the housing, and which runs in the axial direction of the pin element, wherein the pressure device has a second pressure device connecting section which runs through the second recess and connects the first pressure element to the second pressure element, since the first pressure element is very reliably connected to the second pressure element in this case.

Furthermore, it has proven to be advantageous when the second recess is arranged opposite the first recess since a mechanically very stable construction is achieved in this way.

Furthermore, it has proven to be advantageous when the first and the second support element, the first and the second sealing element, the first and the second pressure element and the sleeve are each of hollow-cylindrical design and the pin element has a circular cross-sectional area, since round contours can be sealed off in a particularly reliable manner.

Furthermore, it has proven to be advantageous when the power semiconductor device has a holding body, wherein the pin element is connected to the holding body in a rotationally fixed manner, in particular is injection-moulded into the holding body. As a result, the pin element is mechanically connected to the rest of the power semiconductor device in a very reliable manner.

Furthermore, it has proven to be advantageous when the power semiconductor device has an electrically conductive connecting element which is arranged within the housing and is electrically conductively connected to the power semiconductor component, wherein the sleeve is arranged over the connecting element, since the sleeve can be electrically conductively connected to the connecting element in a simple manner in this case.

In this context, it has proven to be advantageous when the sleeve is arranged on the connecting element. As a result, movement of the sleeve in the direction of the connecting element when the force-generating element generates a force on the load current connection element, which force acts in the direction of the sleeve, is reliably prevented.

Furthermore, it has proven to be advantageous when the housing has a protrusion which runs in the direction of the sleeve, wherein the first support element is arranged on the protrusion. The protrusion forms a reliable abutment for the first support element.

Furthermore, a power semiconductor arrangement comprising a power semiconductor device according to the invention, comprising an electrically conductive load current connection element which has a third recess and is arranged outside the housing in such a way that the pin element runs through the third recess, and comprising a force-generating element which is twisted onto the thread of the pin element and has a thread and generates a force on the load current connection element, which force acts in the direction of the sleeve and the pressure device, as a result of which the load current connection element is arranged pressed against the sleeve and against the first and the second pressure element and an electrically conductive pressure contact is formed between the sleeve and the load current connection element, and as a result of which the first pressure element presses the first sealing element against the first support element in the axial direction of the pin element and in this way causes deformation of the first sealing element in such a way that the first sealing element presses against the housing opening wall and against the sleeve in a perpendicular direction in relation to the axial direction of the pin element, and as a result of which the second pressure element presses the second sealing element against the second support element in the axial direction of the pin element and in this way causes deformation of the second sealing element in such a way that the second sealing element presses against the sleeve and against the pin element in a perpendicular direction in relation to the axial direction of the pin element, has proven to be advantageous.

It should be noted that more than one of the elements described in the singular here can optionally be present.

The above and other aspects, features and advantages of the present invention will become apparent from the following description read in conjunction with the accompanying drawings, in which like reference numerals designate the same elements.

DETAILED DESCRIPTION OF THE PREFERRED EMBODIMENTS

Figure 1:
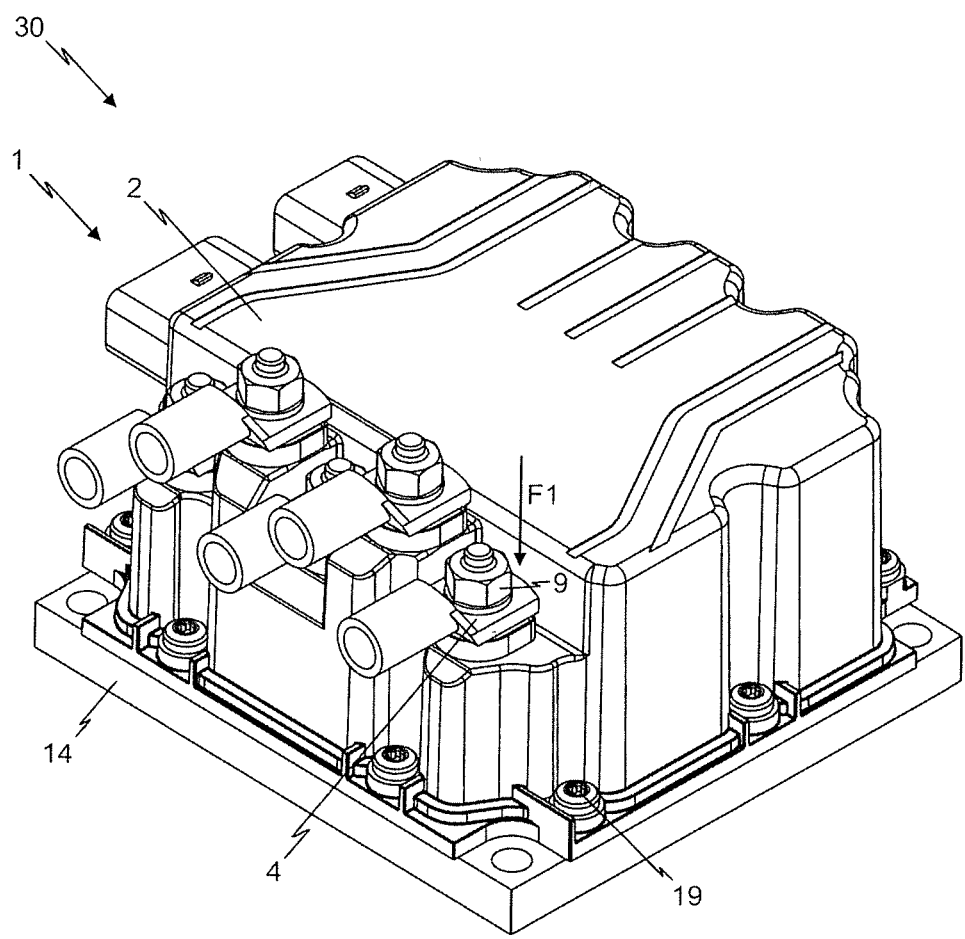
FIG. 1 shows a perspective view of a power semiconductor arrangement comprising a power semiconductor device according to the invention.

Reference will now be made in detail to embodiments of the invention. Wherever possible, same or similar reference numerals are used in the drawings and the description to refer to the same or like parts or steps. The drawings are in simplified form and are not to precise scale. The word 'couple' or 'link' or 'connect' and similar terms do not necessarily denote direct and immediate connections, but also include connections through intermediate elements or devices. For purposes of convenience and clarity only, directional (up/down, etc.) or motional (forward/back, etc.) terms may be used with respect to the drawings. These and similar directional terms should not be construed to limit the scope in any manner. It will also be understood that other embodiments may be utilized without departing from the scope of the present invention, and that the detailed description is not to be taken in a limiting sense, and that elements may be differently positioned, or otherwise noted as in the appended claims without requirements of the written description being required thereto.

In the present text, numerous specific details are set forth in order to provide a thorough understanding of exemplary versions of the present invention. It will be apparent, however, to one skilled in the art, that some versions of the present invention may possibly be practiced without some of these specific details. Indeed, reference in this specification to "a variant," "variants," preference, and "one/the variant," or "one version" and the like, should be understood to mean that a particular feature, structure, or characteristic described in connection with the variant or version is included in at least one such variant or version according to the disclosure. Thus, the appearances of phrases such as "in one variant," "in one version," and the like, in various places in the specification are not necessarily all referring to the same version or variant, nor are separate or alternative versions or variants mutually exclusive of other versions or variants. Moreover, various features may be described which possibly may be exhibited by some variants or versions and not by others. Similarly, various requirements are described which may be requirements for some variants or versions, but not others. Furthermore, as used throughout this specification, the terms 'a', 'an', 'at least' do not denote a limitation of quantity, but rather denote the presence of at least one of the referenced item, in the sense that singular reference of an element does not necessarily exclude the plural reference of such elements. Concurrently, the term "a plurality" denotes the presence of more than one referenced items. Finally, the terms "connected" or "coupled" and related terms are used in an operational sense and are not necessarily limited to a direct connection or coupling.

Various operations may be described as multiple discrete operations in turn, in a manner that may be helpful in understanding embodiments of the present invention; however, the order of description should not be construed to imply that these operations are order dependent.

Figure 2:
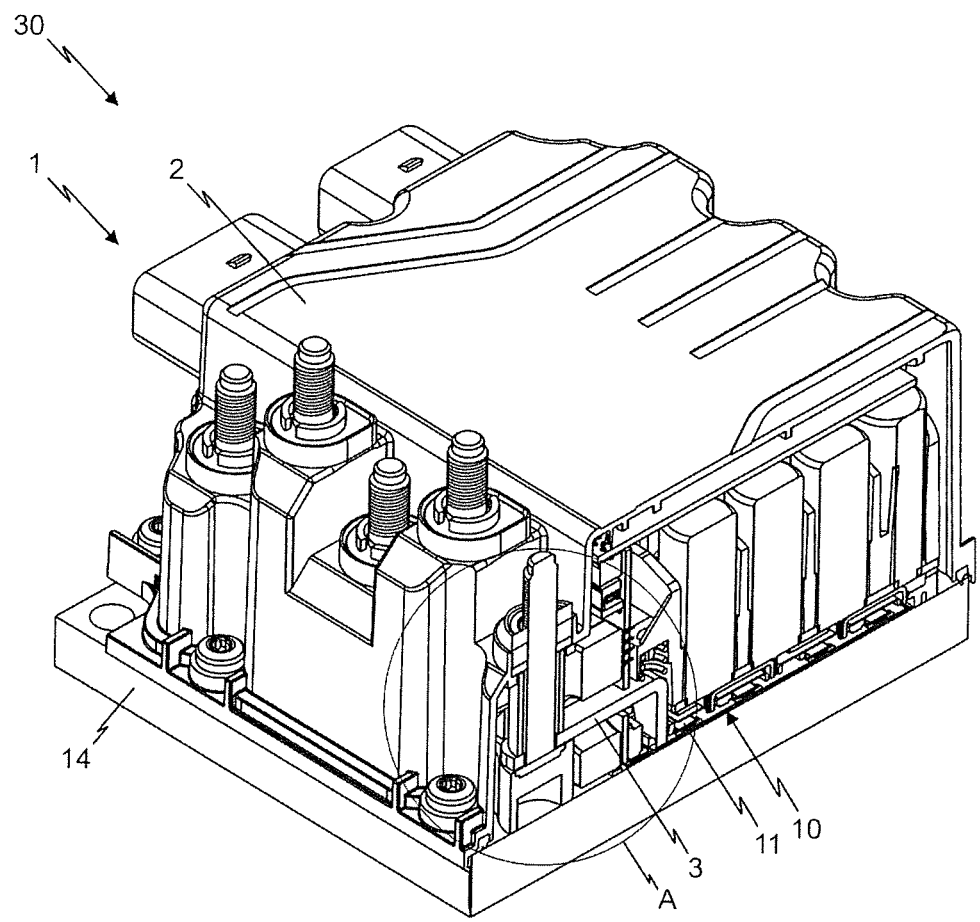
FIG. 2 shows a perspective sectional view of a power semiconductor device according to the invention.
Figure 3:
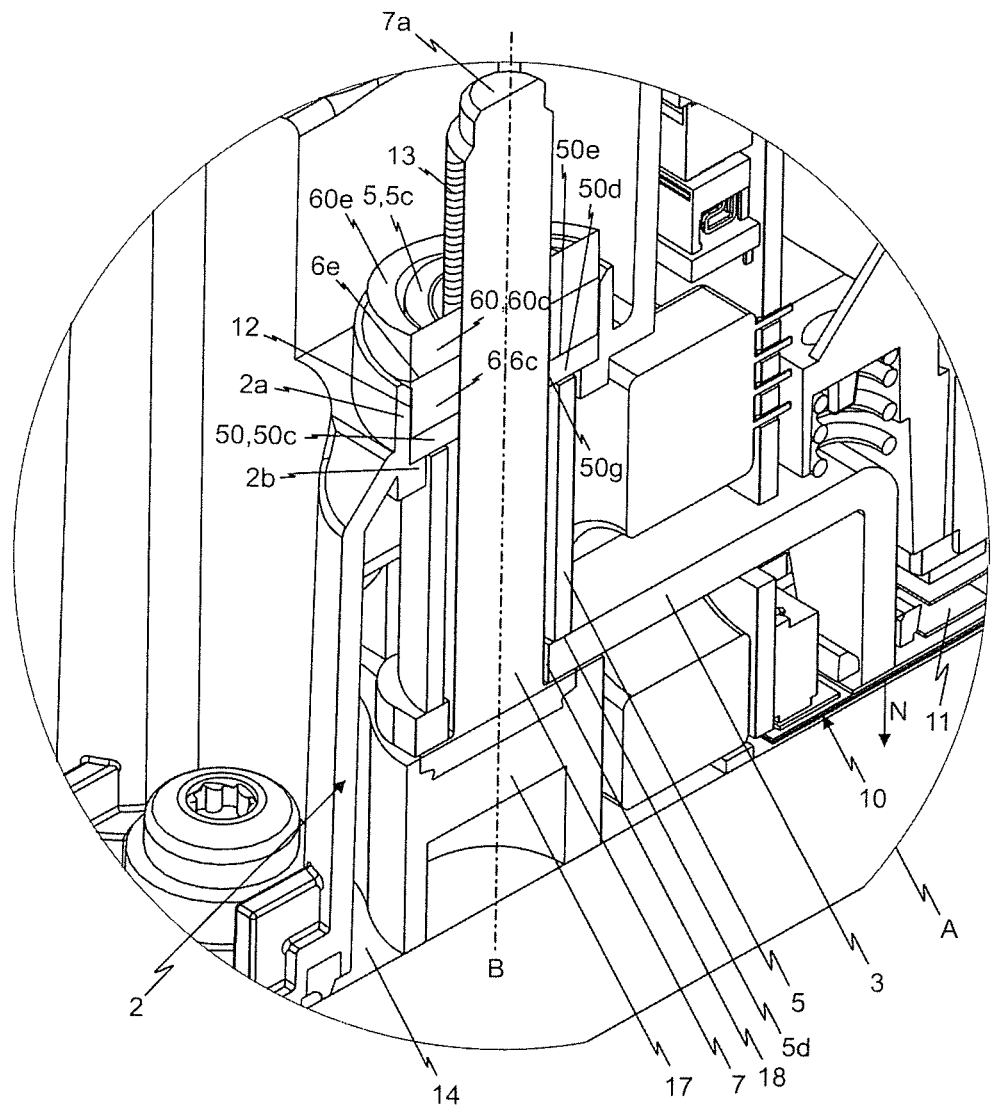
FIG. 3 shows a view of a detail from FIG. 2.
Figure 4:
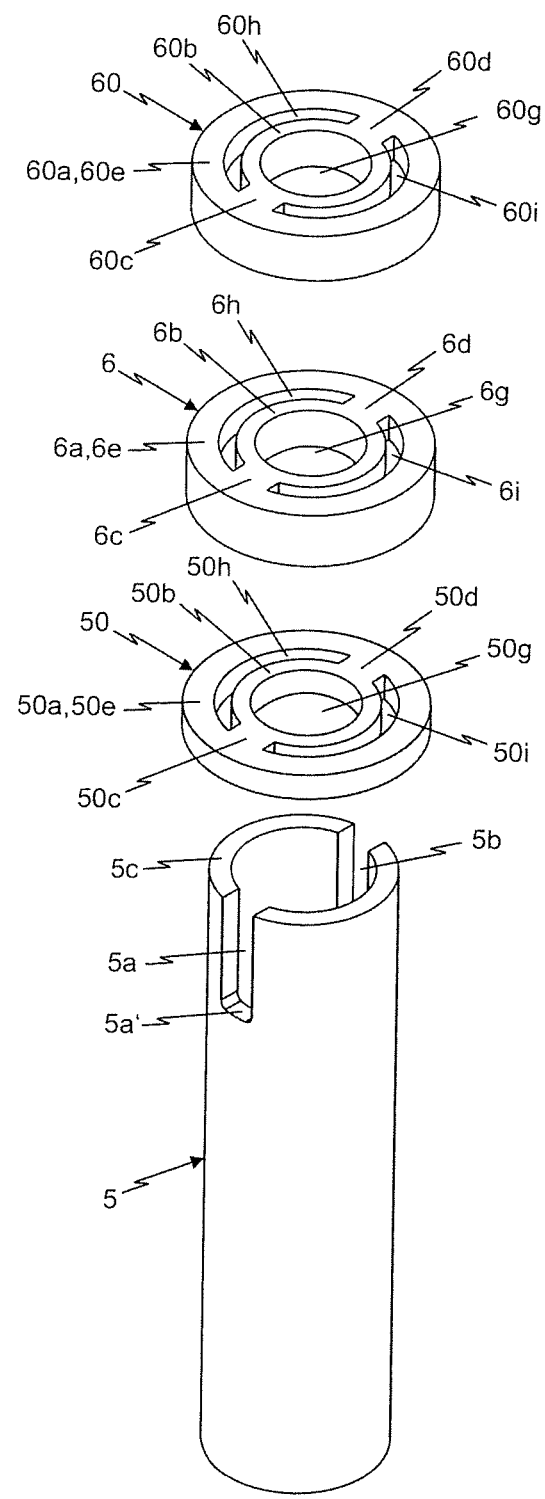
FIG. 4 shows an exploded illustration of a perspective view of a sleeve, a support device, a sealing device and a pressure device of the power semiconductor device according to the invention.
Figure 5:
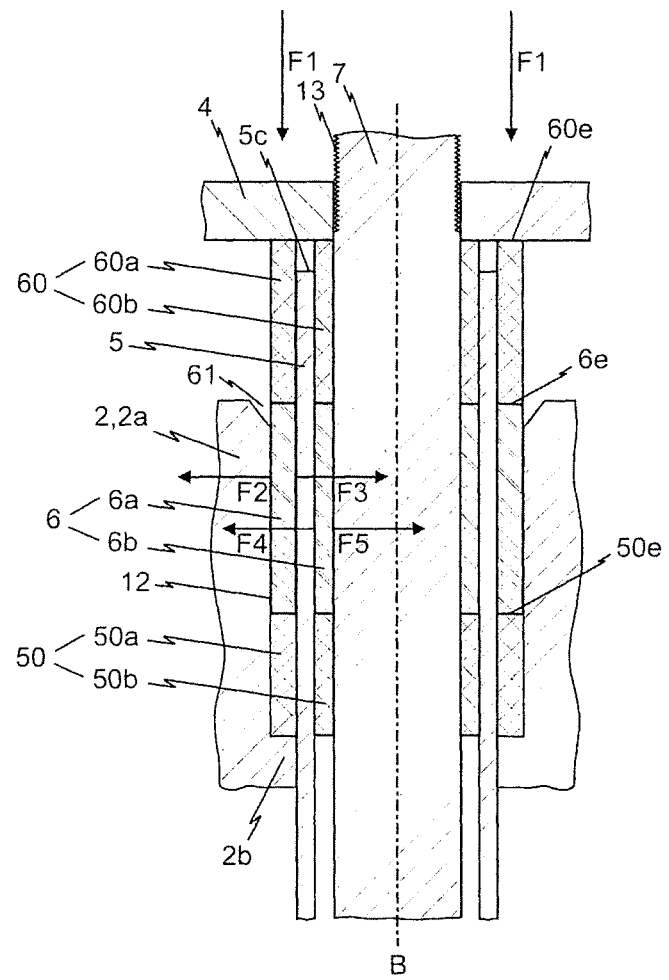
FIG. 5 shows a sectional view of the elements of the power semiconductor arrangement which are arranged in the region of a housing opening of a housing of the power semiconductor device according to the invention.

FIG. 1 shows a perspective view of a power semiconductor arrangement 30 comprising a power semiconductor device 1 according to the invention. FIG. 2 shows a perspective sectional view of the power semiconductor device 1 according to the invention, and FIG. 3 shows an enlarged view of detail A from FIG. 2. FIG. 4 shows an exploded illustration of a perspective view of a sleeve 5, a support device 50, a sealing device 6 and a pressure device 60 of the power semiconductor device 1 according to the invention. FIG. 5 shows a sectional view of the elements of the power semiconductor arrangement 30 which are arranged in the region of a housing opening 12 of a housing 2 of the power semiconductor device 1 according to the invention. The section illustrated in FIG. 2 and FIG. 3 runs through the connecting sections 50c, 50d, 6c, 6d, 60c, 60d of the support device 50, the sealing device 6 and the pressure device 60, and through the recesses 5a and 5b of the sleeve 5 (also see FIG. 4).

The power semiconductor arrangement 30 has a power semiconductor device 1 according to the invention and load current connection elements 4 which are each electrically conductively connected to a respective electrical connection element of the power semiconductor device 1, that is to say to a respective sleeve 5, with the aid of a force-generating element 9 which has a thread and is preferably designed as a screw nut. The load current connection elements 4 can be electrically conductively connected to an electric motor for supplying power to the electric motor, for example. The load current connection elements 4 can be designed, for example, as busbars or cable shoes. The power semiconductor device 1 generally has power semiconductor components 11 which are electrically connected up to form a converter and can, for example, generate the electric currents required for supplying power to an electric motor.

The power semiconductor device 1 has at least one power semiconductor component 11, but generally a plurality of power semiconductor components 11 which are electrically conductively connected to electrically conductive connecting elements 3 which are of one-piece or multiple-piece design. The power semiconductor components 11 are preferably arranged on at least one electrically conductive conductor track of a substrate 10 of the power semiconductor device 1. Here, the power semiconductor components 11 are electrically conductively connected to the at least one conductor track, preferably by means of a soldering or sintering metal layer which is arranged between the power semiconductor components 11 and the conductor tracks. The conductor tracks are formed by an electrically conductive patterned first conduction layer of the substrate 10. The respective power semiconductor component 11 is preferably present in the form of a power semiconductor switch or a diode. Here, the power semiconductor switches are preferably present in the form of transistors, such as IGBTs (Insulated Gate Bipolar Transistors) or MOSFETs (Metal Oxide Semiconductor Field Effect Transistors) for example.

Furthermore, the power semiconductor module 1 preferably has a base plate 14 on which the substrate 10 which, in the context of the exemplary embodiment, is designed as a Direct Copper Bonded Substrate (DCB Substrate) is arranged.

The connecting element 3 is electrically conductively connected to the power semiconductor component 11. Within the scope of the exemplary embodiment, the connecting element 3 is electrically conductively contacted by the substrate 10, for example by means of a materially bonded connection, such as a soldered, sintered or welded connection for example, to this end. The connecting element 3 is preferably at least substantially composed of copper or a copper alloy.

The power semiconductor device 1 has a housing 2 which is preferably composed of plastic. The housing 2 is preferably arranged on the base plate 4 and preferably connected to said base plate, for example by means of screws 19. The housing 2 covers the power semiconductor components 11. The housing 2 has a housing opening 12 through which a pin element 7 of the power semiconductor device 1 runs, which pin element has a thread 13 at least outside the housing 2.

The power semiconductor device 1 furthermore has a support device 50 which is arranged between a housing opening wall 2a of the housing 2, which housing opening wall delimits the housing opening 12 and encircles the pin element 7, and the pin element 7. The support device 50 is preferably formed from a rigid plastic, but can also be formed from metal for example. The support device 50 is, as in the exemplary embodiment, preferably of one-piece design, but can also be of multiple-piece design.

The power semiconductor device 1 furthermore has an elastic sealing device 6 which is arranged between the housing opening wall 2a of the housing 2 and the pin element 7 on the support device 50 and which runs around the pin element 7. The sealing device 6 is in mechanical contact with the support device 50. The sealing device 6 is preferably formed from an elastomer. The elastomer is preferably formed from a crosslinked silicone, in particular from a crosslinked silicone rubber. The sealing device 6 is, as in the exemplary embodiment, preferably of one-piece design, but can also be of multiple-piece design.

The power semiconductor device 1 furthermore has a pressure device 60 which runs around the pin element 7 and is arranged on the sealing device 6. The pressure device 60 is in mechanical contact with the sealing device 6. The pressure device 60 is preferably formed from a rigid plastic, but can also be formed from metal for example. The pressure device 60 is, as in the exemplary embodiment, preferably of one-piece design, but can also be of multiple-piece design.

It should be noted that, for reasons of clarity, the respective pressure device 60 is not illustrated in FIG. 2 for the pin elements 7 which are not illustrated in section.

The support device 50, the sealing device 6 and the pressure device 60 are arranged in a manner stacked one on the other.

The power semiconductor device 1 furthermore has an electrically conductive sleeve 5 which is arranged over the connecting element 3, wherein the pin element 7 runs through the sleeve 5, through a support device opening 50g of the support device 50, through a sealing device opening 6g of the sealing device 6 and through a pressure device opening 60g of the pressure device 60. The sleeve 5 forms an electrical connection element of the power semiconductor device 1, that is to say the sleeve 5 serves to electrically connect an external current-carrying element, such as a load current connection element 4 for example, to the power semiconductor device 1. An electric load current flows through the material of the sleeve 5 during operation of the power semiconductor device 1. The sleeve 5, more precisely that side 5d of the sleeve 5 which faces the connecting element 3, is preferably, as shown in FIGS. 2 and 3, arranged on the connecting element 3 and is in electrically conductive contact with the connecting element 3. In the exemplary embodiment, the sleeve 5 is arranged on the connecting element 3 by way of resting on the connecting element 3. The sleeve 5 can be connected in a materially bonded manner to the connecting element 3, for example by means of a soldered, sintered or welded connection. In the exemplary embodiment, the sleeve 5 is not connected in a materially bonded manner to the connecting element 3. However, the sleeve 5 can also be arranged on the connecting element 3 and be in electrically conductive contact with the connecting element 3 by way of a soldering or sintering layer being arranged between the sleeve 5 and the connecting element 3. When the sleeve 5 is not arranged on the connecting element 3, there can be a narrow air gap between the sleeve 5 and the connecting element 3 in this case. The connecting element 3 preferably has a connecting element recess 18 through which the pin element 7 runs. The pin element 7 preferably runs in the normal direction N of the substrate 10. The sleeve 5 is preferably designed as a hollow cylinder. It should be noted that the sleeve 5 can be, in general, electrically conductively connected to the power semiconductor component 11 by means of any desired electrically conductive connecting means (for example cable, copper strip). The support device 50, the sealing device 6 and the pressure device 60 are respectively not connected in a materially bonded manner to the housing opening wall 2a, the sleeve 5 and to the pin element 7.

A first support element 50a of the support device 50 and a first sealing element 6a of the sealing device 6 are arranged between the sleeve 5 and the housing opening wall 2a. Furthermore, a second support element 50b of the support device 50, a second sealing element 6b of the sealing device 6 and a second pressure element 60b of the pressure device 60 are arranged between the sleeve 5 and the pin element 7. A first pressure element 60a of the pressure device 60 is arranged around the sleeve 5. The respective support element 50a or 50b is preferably of annular design. Furthermore, the respective sealing element 6a or 6b is preferably of annular design. Furthermore, the respective pressure element 60a or 60b is preferably of annular design.

In the case of the invention, the first pressure element 60a is designed to press the first sealing element 6a against the first support element 50a in the axial direction B of the pin element 7 and in this way to cause deformation of the first sealing element 6a in such a way that the first sealing element 6a presses against the housing opening wall 2a and against the sleeve 5 in a perpendicular direction in relation to the axial direction B of the pin element 7, in particular in relation to the axial direction B of the pin element 7 in the radial direction, (see FIG. 5). Furthermore, in the case of the invention, the second pressure element 60b is designed to press the second sealing element 6b against the second support element 50b in the axial direction B of the pin element 7 and in this way to cause deformation of the second sealing element 6b in such a way that the second sealing element 6b presses against the sleeve 5 and against the pin element 7 in a perpendicular direction in relation to the axial direction B of the pin element 7, in particular in relation to the axial direction B of the pin element 7 in the radial direction, (see FIG. 5). When, in the case of the invention, the first pressure element 60a presses the first sealing element 6a against the first support element 50a in the axial direction B of the pin element 7 with a force F1, the elastic first sealing element 6a is then deformed and presses against the housing opening wall 2a with a force F2 and against the sleeve 5 with a force F3 as a result. In this way, in the case of the invention, the first sealing element 6a forms a first gasket seal which seals off the sleeve 5 from the housing opening wall 2a in a very reliable manner with long-term stability. When, in the case of the invention, the second pressure element 60b presses the second sealing element 6b against the second support element 50b in the axial direction B of the pin element 7 with a force F1, the elastic second sealing element 6b is then deformed and presses against the sleeve 5 with a force F4 and against the pin element 7 with a force F5 as a result. In this way, in the case of the invention, the second sealing element 6b forms a second gasket seal which seals off the sleeve 5 from the pin element 7 in a very reliable manner with long-term stability.

As illustrated by way of example in FIG. 5, the housing 5 can have, in the region of the housing opening 12, a cutout 61 which encircles the pin element 7 and into which a portion of the first sealing element 6a is pushed when pressure is applied by the first pressure element 60a. The pin 7 can have a further cutout which encircles the pin element 7 and into which a portion of the second sealing element 6b is pushed when pressure is applied by the second pressure element 60b, this not being illustrated in FIG. 5 for reasons of clarity. As a result, the sealing effect of the respective sealing element 6a or 6b is further improved.

As shown by way of example in FIG. 4, the sleeve 5 preferably has a first recess 5a which starts from its side 5c that faces a pin element outer end 7a of the pin element 7, which pin element outer end is arranged outside the housing 2, and which runs in the axial direction B of the pin element 7. The sleeve 5 has a first recess bottom surface 5a' which delimits the first recess 5a. The support device 50 is of one-piece design and has a first support connecting section 50c which runs through the first recess 5a and is arranged on the first recess bottom surface 5a' and connects the first support element 50a to the second support element 50b. The first recess bottom surface 5a' forms an abutment for the support device 50. The first recess 5a allows for one-piece design of the support device 50 in a simple manner. It should be noted that the support device 50 can also be of multiple-piece design and, in this case, the first and the second support element 50a and 50b can also be designed, for example, as separate support rings or support sleeves.

The sleeve 5 preferably has a second recess 5b which starts from its side 5c that faces a pin element outer end 7a of the pin element 7, which pin element outer end is arranged outside the housing 2, and which runs in the axial direction B of the pin element 7. The sleeve 5 has a second recess bottom surface which delimits the second recess 5b, wherein the support device 50 has a second support connecting section 50d which runs through the second recess 5b and is arranged on the second recess bottom surface and connects the first support element 50a to the second support element 50b. The second recess bottom surface forms a further abutment for the support device 50.

The sealing device 6 is preferably of one-piece design and has a first sealing device connecting section 6c which runs through the first recess 5a and connects the first sealing element 6a to the second sealing element 6b. Furthermore, the sleeve 5 preferably has a second recess 5b which starts from its side 5c that faces a pin element outer end 7a of the pin element 7, which pin element outer end is arranged outside the housing 2, and which runs in the axial direction B of the pin element 7, wherein the sealing device 6 has a second sealing device connecting section 6d which runs through the second recess 5b and connects the first sealing element 6a to the second sealing element 6b.

The pressure device 60 is preferably of one-piece design and has a first pressure device connecting section 60c which runs through the first recess 5a and connects the first pressure element 60a to the second pressure element 60b. Furthermore, in the case of the exemplary embodiment, the pressure device 60 has a second pressure device connecting section 60d which runs through the second recess 5b and connects the first pressure element 60a to the second pressure element 60b.

In the exemplary embodiment, the second recess 5b is arranged opposite the first recess 5a. It should be noted that the sleeve 5 can of course further have at least one further recess which is formed in an identical manner to the first and the second recess 5a and 5b. Therefore, the sleeve 5 can have, for example, three recesses which are arranged at an angle of 120° in relation to one another with respect to the axial direction B of the pin element 7. In this case, the support device 50 preferably has a third support connecting section which runs through the third recess and is arranged on the third recess bottom surface. Analogously, in this case, the sealing device 6 preferably has an analogously arranged third sealing device connecting section, and the pressure device 60 has an analogously arranged third pressure device connecting section.

As illustrated by way of example in FIG. 3, the housing 2 can have a protrusion 2b which runs in the direction of the sleeve 5, wherein the first support element 50a is arranged on the protrusion 2b. The protrusion 2b forms an abutment for the first support element 50a. Furthermore, the pin element 7 can have a further protrusion which runs in the direction of the sleeve 5, wherein the second support element 50b is arranged on the further protrusion, this not being illustrated in FIG. 5 for reasons of clarity. Therefore, the support device 50, the sealing device 6 and, respectively, the pressure device 60 can also be of multiple-piece design.

The first and the second support element 50a and 50b, the first and the second sealing element 6a and 6b, the first and the second pressure element 60a and 60b and the sleeve 5 are each of hollow-cylindrical design in the exemplary embodiment, and the pin element 7 has a circular cross-sectional area in the exemplary embodiment.

The sleeve 5 is preferably composed at least substantially of copper or a copper alloy. The sleeve 5 can have a silver coating.

The power semiconductor device 1 preferably has a holding body 17, wherein the pin element 7 is connected to the holding body 17 in a rotationally fixed manner, in particular is injection-moulded into the holding body 17. The holding body 17 is preferably arranged on the base plate 14 and is preferably connected to the base plate 14, for example by means of a screw connection.

The power semiconductor device 1 can be installed, for example, into a vehicle, such as a forklift truck for example, or, for example, into a switchgear cabinet. The vehicle, the switchgear cabinet or, in general, an external electrical component to which the power semiconductor device 1 according to the invention is intended to be electrically conductively connected has electrically conductive load current connection elements 4 which are provided in order to be electrically conductively connected to the power semiconductor device 1 according to the invention. The power semiconductor arrangement 30 is produced when the load current connection elements 4 are electrically connected to the power semiconductor device 1, more precisely to the sleeves 5. The respective load current connection element 4 is preferably at least substantially composed of copper or a copper alloy.

In order to produce the power semiconductor arrangement 30, an electrically conductive load current connection element 4 which has a third recess is arranged outside the housing 2 of the power semiconductor device 1 in such a way that the pin element 7 runs through the third recess. A force-generating element 9 which has a thread is then arranged and twisted onto the thread 13 of the pin element 7, so that the force-generating element 9 generates a force F1 on the load current connection element 4, which force acts in the direction of the sleeve 5, more precisely a force which acts in the direction of that side 5c of the sleeve 5 which faces the load current connection element 4, and in the direction of the pressure device 60, as a result of which the load current connection element 4 is pressed against the sleeve 5 and against the first and the second pressure element 60a and 60b, and an electrically conductive pressure contact is formed between the sleeve 5 and the load current connection element 4, and as a result of which the first pressure element 60a presses the first sealing element 6a against the first support element 50a in the axial direction B of the pin element 7 and in this way causes deformation of the first sealing element 6a in such a way that the first sealing element 6a presses against the housing opening wall 2a and against the sleeve 5 in a perpendicular direction in relation to the axial direction B of the pin element 7, and as a result of which the second pressure element 60b presses the second sealing element 6b against the second support element 50b in the axial direction B of the pin element 7 and in this way causes deformation of the second sealing element 6b in such a way that the second sealing element 6b presses against the sleeve 5 and against the pin element 7 in a perpendicular direction in relation to the axial direction B of the pin element 7.

It should be noted that, in a state of the power semiconductor device 1, which is illustrated in FIG. 5, in which the first and the second sealing element 6a and 6b are not subjected to pressure by the first and the second pressure element 60a and 60b in the axial direction B of the pin element 7, that side 60e of the pressure device 60 which faces the pin element outer end 7a of the pin element 7 protrudes beyond that side 5c of the sleeve 5 which faces the pin element outer end 7a of the pin element 7 in the axial direction B of the pin element 7. The first and the second pressure element 60a and 60b therefore extend beyond the sleeve 5 in the axial direction B of the pin element 7 in the said state. When the force-generating element 9 generates a force F1 on the load current connection element 4, which force acts in the direction of the pressure device 60, the load current connection element 4 is pressed against the first and the second pressure element 60a and 60b, as a result of which the first and the second pressure element 60a and 60b, given the associated deformation of the first and the second sealing element 6a and 6b, move toward the support device 50 in the axial direction B of the pin element 7 until that side 60e of the pressure device 60 which faces the pin element outer end 7a of the pin element 7 is at least approximately flush with that side 5c of the sleeve 5 which faces the pin element outer end 7a of the pin element 7 in the axial direction B of the pin element 7, and the load current connection element 4 is in electrically conductive pressing contact with the sleeve 5. In this case, the sleeve 5 can be pushed into the load current connection element 4 to a certain extent given a correspondingly strong pressure.

If there is a narrow air gap between the sleeve 5 and the connecting element 3, the air gap is then closed by way of the sleeve 5, owing to the force F1, moving toward the connecting element 3 until it is in mechanical contact and therefore also in electrically conductive contact with the connecting element 3. The connecting element 3 forms an abutment for the sleeve 5. The holding body 17 forms an abutment for the connecting element 3. The load current connection element 4 is electrically conductively connected to the connecting element 3 by means of the sleeve 7. The force-generating element 9 is preferably designed as a screw nut.

It should be noted at this point that features of different exemplary embodiments of the invention, provided that the features are not mutually exclusive, can of course be combined with one another as desired, without departing from the scope of the invention.

Having described at least one of the preferred embodiments of the present invention with reference to the accompanying drawings, it will be apparent to those skills that the invention is not limited to those precise embodiments, and that various modifications and variations can be made in the presently disclosed system without departing from the scope or spirit of the invention. Thus, it is intended that the present disclosure cover modifications and variations of this disclosure provided they come within the scope of the appended claims and their equivalents.

What is claimed is:

1. A power semiconductor device, comprising:
   a power semiconductor component, further comprising: a housing having
      a housing opening;
      said housing, further comprising:
         a pin element which passes through the housing opening and has a thread at extending least outside the housing;
         a support device which is arranged between a housing opening wall of the housing, which housing opening wall delimits the housing opening and encircles the pin element, and the pin element;
         an elastic sealing device which is arranged between the housing opening wall of the housing and the pin element on the support device and runs around the pin element;
         a pressure device which runs around the pin element and is arranged on the sealing device; and
         an electrically conductive sleeve which forms an electrical connection element of the power semiconductor device;
         the pin element runs through the sleeve, through a support device opening of the support device, through a sealing device opening of the sealing device and through a pressure device opening of the pressure device;
      a first support element of the support device and a first sealing element of the sealing device are arranged between the sleeve and the housing opening wall;
      a second support element of the support device, a second sealing element of the sealing device and a second pressure element of the pressure device are arranged between the sleeve and the pin element;
      a first pressure element of the pressure device is arranged around the sleeve;
      the first pressure element is designed to press the first sealing element against the first support element in the axial direction of the pin element and in this way to cause deformation of the first sealing element in such a way that the first sealing element presses against the housing opening wall and against the sleeve in a perpendicular direction in relation to the axial direction of the pin element;
         wherein the second pressure element is designed to press the second sealing element against the second support element in the axial direction of the pin element and in this way to cause deformation of the second sealing element in such a way that the second sealing element presses against the sleeve and against the pin element in a perpendicular direction in relation to the axial direction of the pin element;
      the sealing device is formed from an elastomer;
      said elastomer being at least one of a crosslinked silicone and a crosslinked silicone rubber;
      the power semiconductor device has a holding body; and
      wherein the pin element is connected to the holding body in a rotationally fixed manner, in particular is injection-molded into the holding body.

2. The power semiconductor device, according to claim 1, wherein:
   the sleeve has a first recess which starts from its side that faces a pin element outer end of the pin element, which pin element outer end is arranged outside the housing, and which runs in the axial direction of the pin element;
   the sleeve has a first recess bottom surface which delimits the first recess; and
   the support device is of one-piece design and has a first support connecting section which runs through the first recess and is arranged on the first recess bottom surface and connects the first support element to the second support element.

3. The power semiconductor device, according to claim 2, wherein:
   the sleeve has a second recess which starts from its side that faces a pin element outer end of the pin element;
   an outer end of said pin element is arranged outside the housing, and which runs in the axial direction of the pin element;
   wherein the sleeve has a second recess bottom surface which delimits the second recess, wherein the support device has a second support connecting section which runs through the second recess and is arranged on the second recess bottom surface and connects the first support element to the second support element.

4. The power semiconductor device, according to claim 3, wherein:

the sealing device is of one-piece design and has a first sealing device connecting section which runs through the first recess and connects the first sealing element to the second sealing element.

5. The power semiconductor device, according to claim 4, wherein:
the sleeve has a second recess which starts from its side that faces a pin element outer end of the pin element;
wherein a pin element outer end is arranged outside the housing, and which runs in the axial direction of the pin element; and
wherein the sealing device has a second sealing device connecting section which runs through the second recess and connects the first sealing element to the second sealing element.

6. The power semiconductor device, according to claim 5, wherein:
the pressure device is of one-piece design and has a first pressure device connecting section which runs through the first recess and connects the first pressure element to the second pressure element.

7. The power semiconductor device, according to claim 6, wherein:
the sleeve has a second recess which starts from its side that faces a pin element outer end of the pin element;
wherein a pin element outer end is arranged outside the housing, and which runs in the axial direction of the pin element; and
wherein the pressure device has a second pressure device connecting section which runs through the second recess and connects the first pressure element to the second pressure element.

8. The power semiconductor device, according to claim 3, wherein:
the second recess is arranged opposite the first recess.

9. The power semiconductor device, according to claim 1, wherein:
the first and the second support element, the first and the second sealing element, the first and the second pressure element and the sleeve are each of hollow-cylindrical design and the pin element has a circular cross-sectional area.

10. The power semiconductor device, according to claim 1, wherein:
the power semiconductor device has an electrically conductive connecting element which is arranged within the housing and is electrically conductively connected to the power semiconductor component; and
wherein the sleeve is arranged over the connecting element.

11. The power semiconductor device, according to claim 10, wherein:
the sleeve is arranged on the connecting element.

12. The power semiconductor device, according to claim 1, wherein:
the housing has a protrusion which runs in the direction of the sleeve, wherein the first support element is arranged on the protrusion.

13. A power semiconductor arrangement, comprising:
a power semiconductor device which is designed according to claim 1, further comprising:
an electrically conductive load current connection element which has a third recess and is arranged outside the housing in such a way that the pin element runs through the third recess; and
a force-generating element which is twisted onto the thread of the pin element and has a thread and generates a force on the load current connection element, which force acts in the direction of the sleeve and the pressure device, as a result of which the load current connection element is arranged pressed against the sleeve and against the first and the second pressure element (60*a*, 60*b*) and an electrically conductive pressure contact is formed between the sleeve and the load current connection element, and as a result of which the first pressure element presses the first sealing element against the first support element in the axial direction of the pin element and in this way causes deformation of the first sealing element in such a way that the first sealing element presses against the housing opening wall and against the sleeve in a perpendicular direction in relation to the axial direction of the pin element, and as a result of which the second pressure element presses the second sealing element against the second support element in the axial direction of the pin element and in this way causes deformation of the second sealing element in such a way that the second sealing element presses against the sleeve and against the pin element in a perpendicular direction in relation to the axial direction of the pin element.

* * * * *